(12) United States Patent
Takasu et al.

(10) Patent No.: US 11,681,058 B2
(45) Date of Patent: Jun. 20, 2023

(54) RADIATION DETECTOR

(71) Applicant: KABUSHIKI KAISHA TOSHIBA, Tokyo (JP)

(72) Inventors: Isao Takasu, Setagaya (JP); Atsushi Wada, Kawasaki (JP); Kohei Nakayama, Kawasaki (JP); Yuko Nomura, Kawasaki (JP); Fumihiko Aiga, Kawasaki (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 17/650,754

(22) Filed: Feb. 11, 2022

(65) Prior Publication Data

US 2023/0023509 A1 Jan. 26, 2023

(30) Foreign Application Priority Data

Jul. 26, 2021 (JP) .............................. JP2021-121240

(51) Int. Cl.
| | |
|---|---|
| *G01T 1/20* | (2006.01) |
| *A44C 5/00* | (2006.01) |
| *G01T 7/00* | (2006.01) |
| *H10K 39/36* | (2023.01) |

(52) U.S. Cl.
CPC ........ *G01T 1/20188* (2020.05); *A44C 5/0015* (2013.01); *G01T 7/00* (2013.01); *H10K 39/36* (2023.02)

(58) Field of Classification Search
CPC ....... G01T 1/20188; G01T 7/00; G01T 1/023; G01T 1/026; G01T 1/20; G01T 1/24; A44C 5/0015; H10K 39/36
See application file for complete search history.

(56) References Cited

U.S. PATENT DOCUMENTS

| | | | |
|---|---|---|---|
| 2007/0012879 A1* | 1/2007 | Testardi | ................. G01T 1/201 250/361 R |
| 2018/0143329 A1 | 5/2018 | Takasu et al. | |
| 2022/0085108 A1 | 3/2022 | Wada et al. | |

FOREIGN PATENT DOCUMENTS

JP 2018-85387 A 5/2018

* cited by examiner

*Primary Examiner* — Kiho Kim
(74) *Attorney, Agent, or Firm* — Oblon, McClelland, Maier & Neustadt, L.L.P.

(57) ABSTRACT

According to one embodiment, a radiation detector includes first and second resin members, a detection part, a wiring part, and a controller. The first resin member includes first and second partial regions, and a third partial region between the first and second partial regions. The second resin member includes fourth and fifth partial regions. The detection part is provided between the first and fourth partial regions. The detection part includes a first conductive layer, a second conductive layer provided between the first conductive layer and the fourth partial region, and an organic semiconductor layer provided between the first and second conductive layers. The wiring part is provided between the third and fifth partial regions. The wiring part includes first and second wiring layers. The controller is fixed to the second partial region. The controller is electrically connected with the first and second wiring layers.

20 Claims, 5 Drawing Sheets

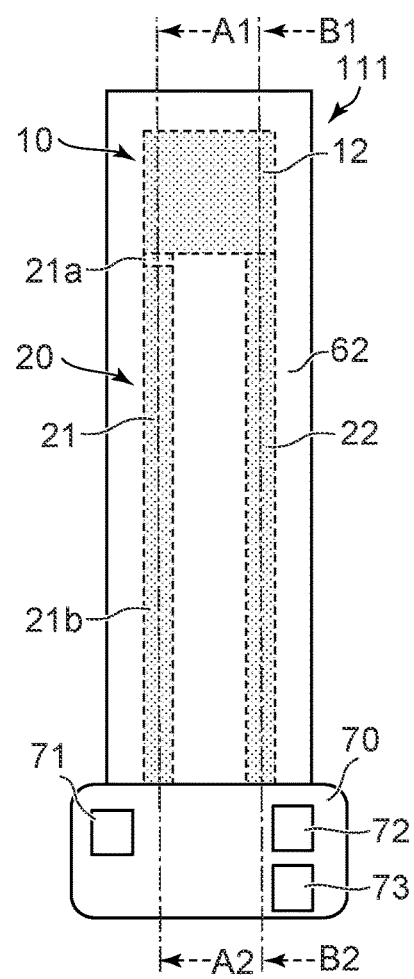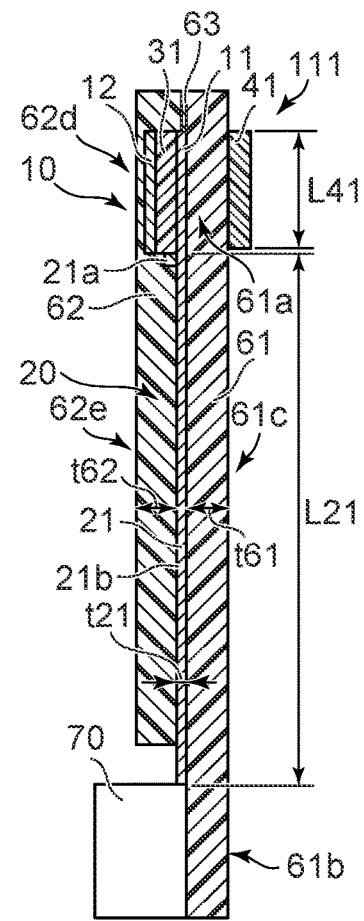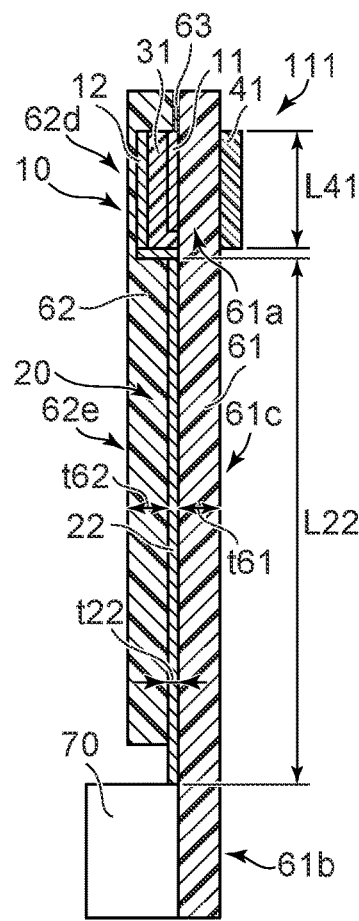

RADIATION DETECTOR

CROSS-REFERENCE TO RELATED APPLICATIONS

This application is based upon and claims the benefit of priority from Japanese Patent Application No. 2021-121240, filed on Jul. 26, 2021; the entire contents of which are incorporated herein by reference.

FIELD

Embodiments described herein relate generally to a radiation detector.

BACKGROUND

Expansion of applications of radiation detectors is desired.

BRIEF DESCRIPTION OF THE DRAWINGS

FIGS. 3A to 3C are schematic views illustrating a radiation detector according to the first embodiment;

DETAILED DESCRIPTION

Figure 1A:
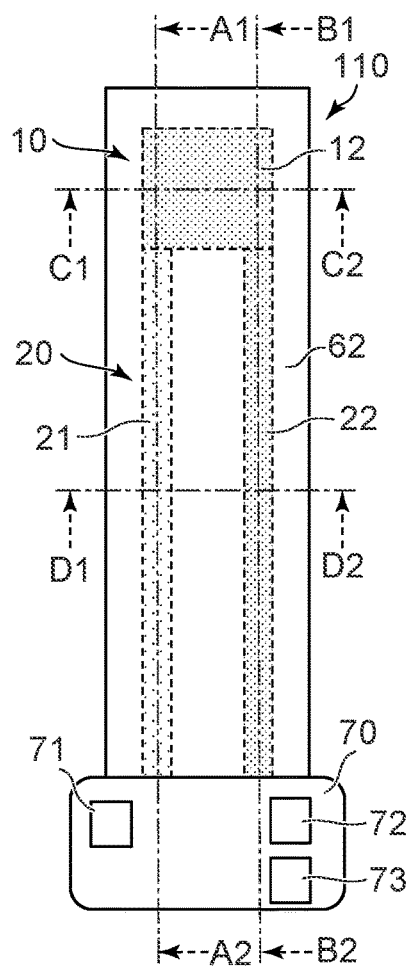
FIGS. 1A to 1E are schematic views illustrating a radiation detector according to a first embodiment.

According to one embodiment, a radiation detector includes a first resin member, a second resin member, a detection part, a wiring part, and a controller. The first resin member includes a first partial region, a second partial region, and a third partial region between the first partial region and the second partial region. The second resin member includes a fourth partial region and a fifth partial region. The detection part is provided between the first partial region and the fourth partial region in a first direction. The detection part includes a first conductive layer, a second conductive layer provided between the first conductive layer and the fourth partial region, and an organic semiconductor layer provided between the first conductive layer and the second conductive layer. The first direction crosses a second direction from the second partial region to the first partial region. The wiring part is provided between the third partial region and the fifth partial region in the first direction. The wiring part includes a first wiring layer electrically connected with the first conductive layer, and a second wiring layer electrically connected with the second conductive layer. A third direction from the first wiring layer to the second wiring layer crosses a plane including the first direction and the second direction. The controller is fixed to the second partial region. The controller is electrically connected with the first wiring layer and the second wiring layer. The controller is configured to output a detection signal according to an intensity of radiation incident on the detection part.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

FIGS. 1A to 1E are schematic views illustrating a radiation detector according to a first embodiment.

FIG. 1A is a plan view. FIGS. 1B to 1E are cross-sectional views corresponding to A1-A2 line, B1-B2 line, C1-C2 line, and D1-D2 line of FIG. 1A, respectively.

Figure 1B:
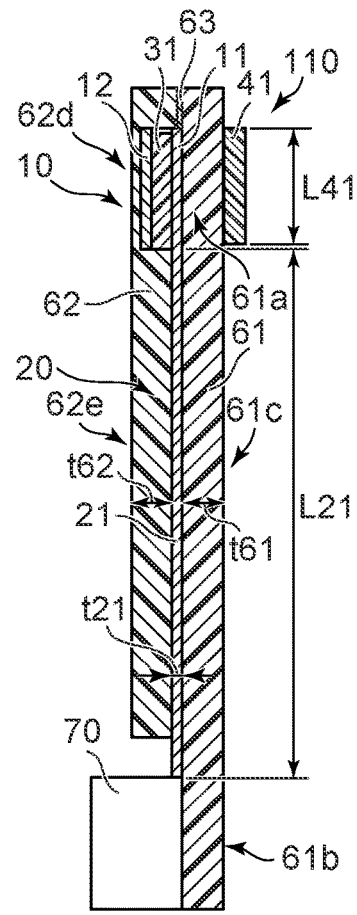
Figure 1C:
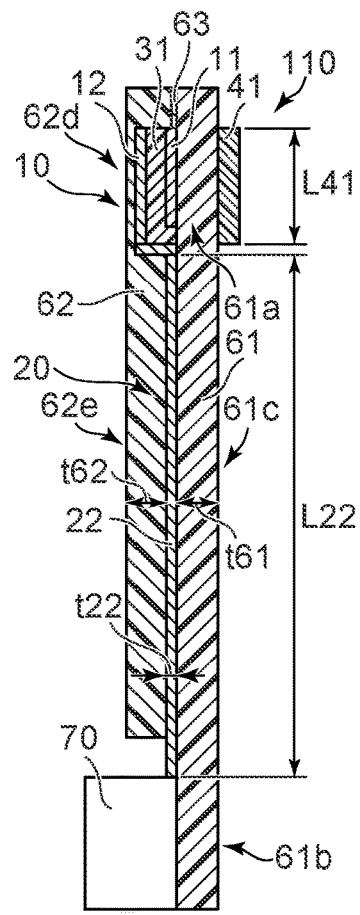

As shown in FIGS. 1B and 1C, a radiation detector 110 according to the embodiment includes a first resin member 61, a second resin member 62, a detection part 10, a wiring part 20, and a controller 70.

The first resin member 61 includes a first partial region 61a, a second partial region 61b, and a third partial region 61c. The third partial region 61c is between the first partial region 61a and the second partial region 61b. In the first resin member 61, these partial regions may be continuous with each other. The boundaries between these subregions may be unclear.

The second resin member 62 includes a fourth partial region 62d and a fifth partial region 62e. In the second resin member 62, these partial regions may be continuous with each other. The boundaries between these subregions may be unclear. The detection part 10 is provided between the first partial region 61a and the fourth partial region 62d in a first direction.

The first direction is a Z-axis direction. One direction perpendicular to the Z-axis direction is defined as a Y-axis direction. The direction perpendicular to the Z-axis direction and the Y-axis direction is defined as an X-axis direction.

The detection part 10 includes a first conductive layer 11, a second conductive layer 12, and an organic semiconductor layer 31. The second conductive layer 12 is provided between the first conductive layer 11 and the fourth partial region 62d. The organic semiconductor layer 31 is provided between the first conductive layer 11 and the second conductive layer 12. A direction from the first conductive layer 11 to the second conductive layer 12 corresponds to the first direction (Z-axis direction). The first direction crosses a second direction from the second partial region 61b to the first partial region 61a. The second direction is, for example, the Y-axis direction.

The wiring part 20 is provided between the third partial region 61c and the fifth partial region 62e in the first direction (Z-axis direction). The wiring part 20 includes a first wiring layer 21 and a second wiring layer 22. The first wiring layer 21 is electrically connected with the first conductive layer 11. The second wiring layer 22 is electrically connected with the second conductive layer 12. A third direction from the first wiring layer 21 to the second wiring layer 22 crosses a plane (Z-Y plane) including the first direction and the second direction. The third direction is, for example, the X-axis direction.

The controller 70 is fixed to the second partial region 61b. The controller 70 is electrically connected with the first wiring layer 21 and the second wiring layer 22. The controller 70 is configured to output a detection signal according to the intensity of the radiation incident on the detection part 10.

Figure 1D:
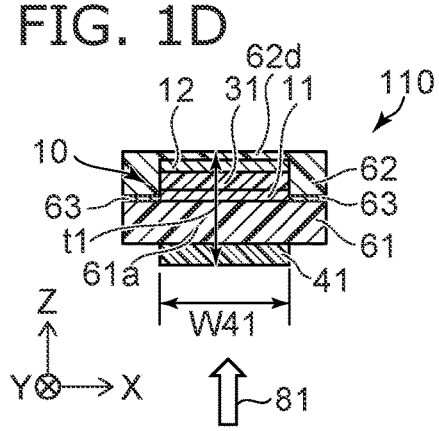

As shown in FIG. 1D, the radiation 81 is incident on the detection part 10. In the organic semiconductor layer 31 of the detection part 10, an electric charge corresponding to the radiation 81 is generated. By taking out this electric charge through the first conductive layer 11 and the second conductive layer 12, a signal corresponding to the intensity of the radiation 81 can be obtained.

In this example, a scintillator layer 41 is provided. In this example, the first partial region 61a is between the scintillator layer 41 and the detection part 10 in the first direction (Z-axis direction). For example, the radiation 81 is incident on the scintillator layer 41. In the scintillator layer 41, light corresponding to the radiation 81 is generated. The light passes through the first partial region 61a and enters the detection part 10. In the organic semiconductor layer 31 of the detection part 10, an electric charge is generated according to the light. By taking out this electric charge through the first conductive layer 11 and the second conductive layer 12, a signal corresponding to the intensity of the radiation 81 can be obtained.

In the embodiment, the detection part 10 and the wiring part 20 are provided between the first resin member 61 and the second resin member 62. The rigidity of the resin member is low. The portion corresponding to the wiring part 20 is flexible. The wiring part 20 is easily deformed.

As will be described later, the radiation detector 110 can be used by being fixed to a body (for example, a hand) of a human subject. For example, the human subject may be a healthcare professional. For example, the human subject's hand while working may be in an area irradiated with radiation 81 for medical or diagnostic purposes. At this time, the radiation 81 is incident on the hand of the human subject, for example, and the hand is exposed to radiation. In such cases, it is expected to detect the degree of exposure.

In such an application, it is desired that the radiation 81 for medical treatment or diagnosis is not substantially attenuated by the detection part 10 and the wiring part 20. By suppressing the attenuation, appropriate medical treatment or appropriate diagnosis can be performed. Further, it is desired that the detection part 10 and the wiring part 20 do not interfere with the work.

In the embodiment, by using the resin members and the organic semiconductor layer 31, the attenuation of the radiation 81 is suppressed. As a result, appropriate medical treatment or appropriate diagnosis can be performed. Further, as described above, by using the resin member and the wiring part 20, the portion corresponding to the wiring part 20 can be easily deformed. As a result, it is possible to suppress the work from being disturbed. According to the embodiment, it is possible to provide a radiation detector applicable to such an application. According to the embodiment, it is possible to provide a radiation detector whose use can be expanded.

In the embodiment, the first wiring layer 21 and the second wiring layer 22 do not overlap in the Z-axis direction. As a result, the wiring part 20 including these wiring layers can be easily deformed.

Figure 1E:
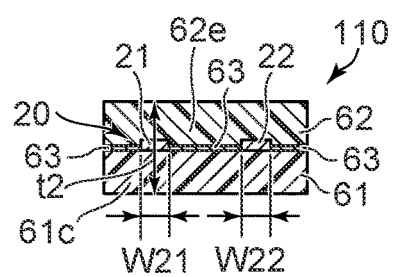

As shown in FIG. 1E, in this example, a part of the second resin member 62 is located between the first wiring layer 21 and the second wiring layer 22 in the third direction (X-axis direction). As a result, the positions of the first wiring layer 21 and the second wiring layer 22 are easily fixed. In the embodiment, at least one of a part of the first resin member 61 or a part of the second resin member 62 is located between the first wiring layer 21 and the second wiring layer 22 in the third direction (X-axis direction). The positions of the first wiring layer 21 and the second wiring layer 22 are easily fixed.

As shown in FIG. 1B, a length of the first wiring layer 21 along the second direction (Y-axis direction) is defined as a first wiring layer length L21. As shown in FIG. 1E), a length (width) of the first wiring layer 21 along the third direction (X-axis direction) is defined as a first wiring layer width W21. The first wiring layer length L21 is larger than the first wiring layer width W21.

As shown in FIG. 1C, a length of the second wiring layer 22 along the second direction (Y-axis direction) is defined as a second wiring layer length L22. As shown in FIG. 1E, a length (width) of the second wiring layer 22 along the third direction (X-axis direction) is defined as a second wiring layer width W22.

The second wiring layer length L22 is larger than the second wiring layer width W22.

For example, the first wiring layer length L21 is not less than 5 cm and not more than 30 cm. For example, the second wiring layer length L22 is not more than 5 cm and not more than 30 cm. With such lengths, it is possible to suppress the radiation 81 that is incident on the detection part 10 while the human subject is working to be incident on the controller 70. In the controller 70, the radiation 81 is greatly attenuated. With such lengths, the controller 70 can be appropriately separated from the region where the radiation 81 is incident. The attenuation of the radiation 81 by the controller 70 can be suppressed. With such lengths, the portion corresponding to the wiring part 20 can be easily deformed.

In the embodiment, for example, the first wiring layer width W21 is less than 0.5 mm and not more than 5 mm. For example, the second wiring layer width W22 is not less than 0.5 mm and not more than 5 mm. With such widths, signals can be transmitted with practically low electrical resistance. Noise can be suppressed.

As shown in FIG. 1B, a length (thickness) of the first wiring layer 21 along the first direction (Z-axis direction) is defined as a first wiring layer thickness t21. The first wiring layer width W21 is preferably larger than the first wiring layer thickness t21. As shown in FIG. 1C, a length (thickness) of the second wiring layer 22 along the first direction (Z-axis direction) is defined as a second wiring layer thickness t22. The second wiring layer width W22 is preferably larger than the second wiring layer thickness t22. With such configurations, for example, low electrical resistance and high flexibility can be easily obtained. In the embodiment, the first wiring layer thickness t21 is, for example, not less than 50 nm and not more than 500 nm. The second wiring layer thickness t22 is, for example, not less than 50 nm and not more than 1000 nm. With such thicknesses, the radiation 81 can be efficiently detected while suppressing the attenuation of the radiation 81.

As shown in FIGS. 1B and 1C, a thickness of the third partial region 61c along the first direction (Z-axis direction) is defined as a thickness t61. In the embodiment, the thickness t61 is preferably not less than 10 μm and not more than 100 μm. As shown in FIGS. 1B and 1C, a thickness of the fifth partial region 62e along the first direction (Z-axis direction) is defined as a thickness t62. In the embodiment, the thickness t62 is preferably not less than 10 μm and not more than 100 μm. With such a thickness t61 and a thickness t62, good flexibility can be easily obtained. With such a thickness, for example, the wiring part 20 is stably held by the third partial region 61c and the fifth partial region 62e.

As shown in FIG. 1D, a thickness of the stacked boy including the scintillator layer 41, the first partial region 61a, the detection part 10 and the fourth partial region 62d along the first direction (Z-axis direction) is defined as a thickness t1. As shown in FIG. 1E, a thickness of the stacked body including the third partial region 61c, the wiring part 20, and the fifth partial region 62e is defined as a thickness t2. The thickness t2 is preferably thinner than the thickness t1. As a result, high flexibility can be obtained in the portion corresponding to the wiring part 20.

A difference between the thickness t2 and the thickness t1 may substantially correspond to the thickness of the scintillator layer 41, for example. The thickness of the scintillator layer 41 (the length along the first direction) is, for example, not less than 0.1 μm and not more than 5000 μm. Radiation 81 can be efficiently converted into light. High sensitivity can be obtained.

The length L41 of the scintillator layer 41 in the second direction (Y-axis direction) (see FIG. 1B) is shorter than the first wiring layer length L21 and shorter than the second wiring layer length L22. Since the portion including the scintillator layer 41 is short, good flexibility can be obtained. In the embodiment, the length L41 is, for example, not less than 1 mm and note more than 10 mm. The width of the scintillator layer 41 along the X-axis direction (see FIG. 1D) is, for example, not less than 1 mm and not more than 10 mm. With such a length, the radiation 81 can be detected with high sensitivity.

In the embodiment, for example, the first conductive layer 11 preferably includes a compound including a first element and oxygen. The first element includes at least one selected from the group consisting of In, Sn, Ti and Zn. At least a part of the first conductive layer 11 may include, for example, indium oxide, ITO (Indium Tin Oxide), or the like. At least a part of the first conductive layer 11 has, for example, light transmissivity. The light generated in the first scintillator layer 41 can be efficiently incident on the first organic semiconductor layer 31. High sensitivity is easy to obtain.

The second conductive layer 12 preferably includes, for example, at least one selected from the group consisting of Al, Ag and Mg. With such a material, it is possible to suppress the attenuation of the radiation 81 in the second conductive layer 12.

As shown in FIGS. 1B to 1E, the radiation detector 110 may include an intermediate resin layer 63. The first resin member 61 and the second resin member 62 may be adhered to each other by the intermediate resin layer 63. The intermediate resin layer 63 may include, for example, an ultraviolet curable resin or the like.

As shown in FIG. 1A, the controller 70 may include a transmission circuit 71. The transmission circuit 71 is configured to wirelessly transmit the detection signal.

As shown in FIG. 1A, the controller 70 may include a power supply part 72. The power supply part 72 is configured to control the potential (for example, bias voltage) between the first wiring layer 21 and the second wiring layer 22. The power supply part 72 may include a battery.

As shown in FIG. 1A, the controller 70 may include a detection circuit 73. The detection circuit 73 is configured to detect a signal corresponding to the intensity of the radiation 81 generated between the first conductive layer 11 and the second conductive layer 12. The detection circuit 73 is configured to generate a detection signal based on the signal generated between the first conductive layer 11 and the second conductive layer 12.

Figure 2:
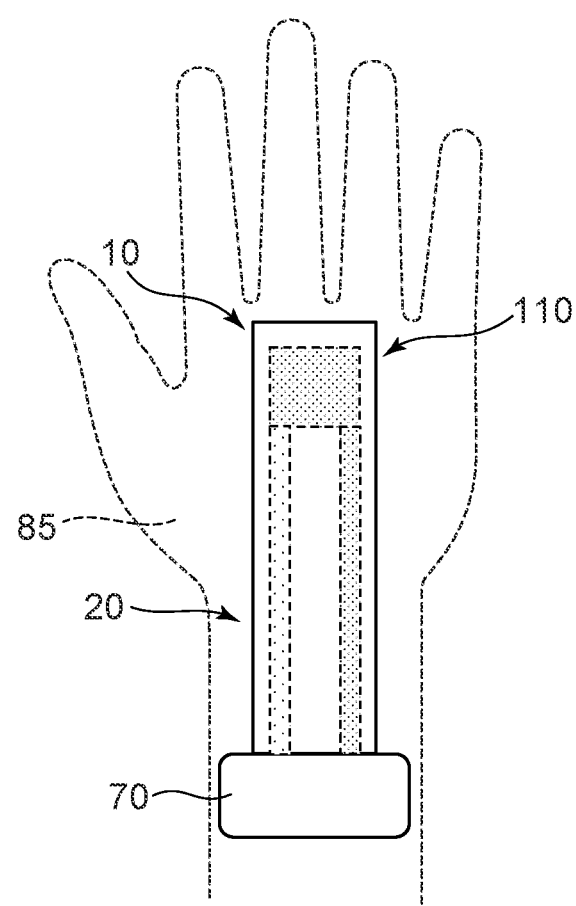
FIG. 2 is a schematic diagram illustrating a usage state of the radiation detector according to the first embodiment.

FIG. 2 is a schematic diagram illustrating a usage state of the radiation detector according to the first embodiment.

As shown in FIG. 2, the radiation detector 110 can be provided in a hand of the human subject 85 or the like. The detection part 10 is provided at a position corresponds to, for example, the position of the back of the hand. The controller 70 is provided at a position corresponds to, for example, the position of the wrist or arm. The detection part 10 can detect the radiation 81 incident on the hand of the human subject 85 during work. The portion corresponding to the wiring part 20 is easily deformed. As a result, the obstruction of work can be suppressed.

FIGS. 3A to 3C are schematic views illustrating a radiation detector according to the first embodiment.

FIG. 3A is a plan view. FIGS. 3B and 3C are cross-sectional views corresponding to the lines A1-A2 and B1-B2 of FIG. 3A, respectively.

As shown in FIGS. 3A and 3B, in a radiation detector 111, the first wiring layer 21 includes a first conductive region 21a and a second conductive region 21b. Other configurations of the radiation detector 111 may be the same as the configuration of the radiation detector 110.

In the radiation detector 111, the second conductive region 21b is electrically connected with the first conductive region 21a. The first conductive region 21a include a compound including the first element and oxygen. The first element includes at least one selected from the group consisting of In, Sn, Ti and Zn. The first conductive region 21a may include, for example, indium oxide, ITO, or the like. The first conductive region 21a has, for example, light transmissivity. The second conductive region 21b includes at least one selected from the group consisting of Al, Ag and Mg. By applying members made of different materials in this way, it is easy to obtain low electrical resistance while suppressing the attenuation of the radiation 81.

A distance between the controller 70 and the second conductive region 21b is shorter than a distance between the controller 70 and the first conductive region 21a. The first conductive region 21a is provided near the detection part 10. The second conductive region 21b is provided near the controller 70.

Second Embodiment

Figure 4:
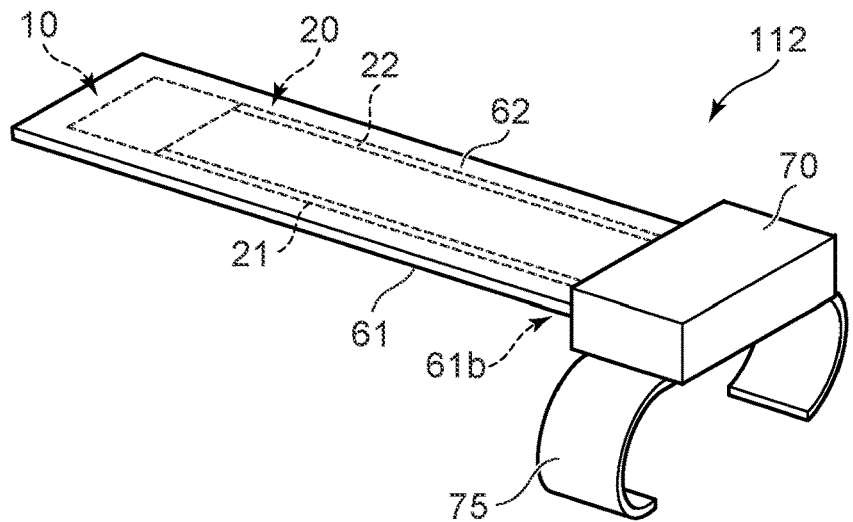
FIG. 4 is a schematic perspective view illustrating a radiation detector according to a second embodiment.

FIG. 4 is a schematic perspective view illustrating a radiation detector according to a second embodiment.

Figure 5:
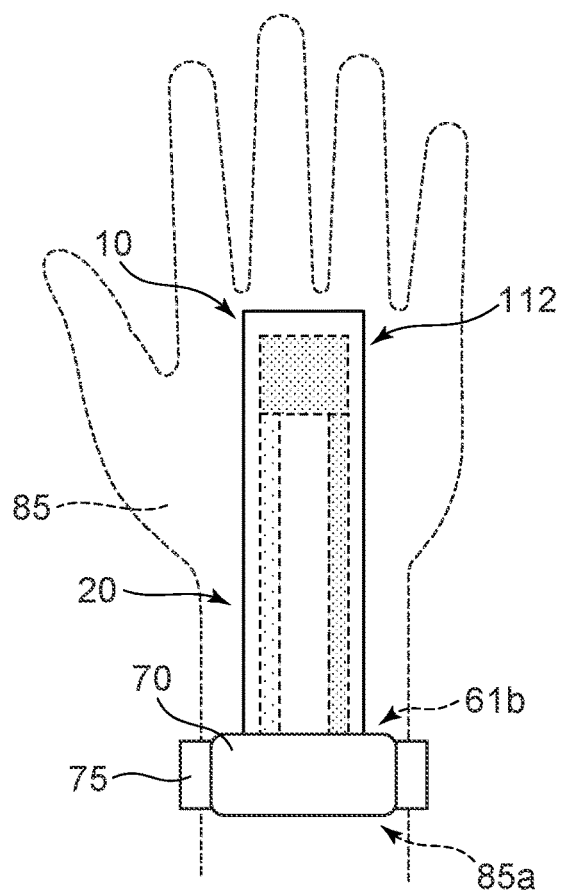
FIG. 5 is a schematic diagram illustrating a usage state of the radiation detector according to the second embodiment.

FIG. 5 is a schematic diagram illustrating a usage state of the radiation detector according to the second embodiment.

As shown in FIG. 4, a radiation detector 112 according to the embodiment includes a first holding part 75. Other configurations of the radiation detector 112 may be the same as the configuration of the radiation detector 110 or the radiation detector 111.

The first holding part 75 is fixed to at least one of the second partial region 61b of the first resin member 61 or the controller 70. In this example, the first holding part 75 includes two curved portions.

As shown in FIG. 5, the first holding part 75 is configured to determine a positional relationship between a position of one part (first portion 85a) of the body of the human subject 85 and a position of the at least one of the second partial region 61b or the controller 70. In this example, the first portion 85a is sandwiched between the two curved portions of the first holding part 75. The At least one of in the second partial region 61b and the controller 70 is fixed to the first portion 85a. By providing the first holding part 75, an easy-to-use radiation detector can be provided. The radiation detector is more versatile.

In this example, the first portion 85a may be, for example, at least one of the body arms, hands or wrists of the human subject 85. The first holding part 75 may have an arbitrary shape such as a belt shape. In the radiation detector 112, the detection part 10 may be fixed to gloves of the human subject 85 or the like. For example, the detection part 10 may be located between laminated double gloves and the like.

Figure 6:
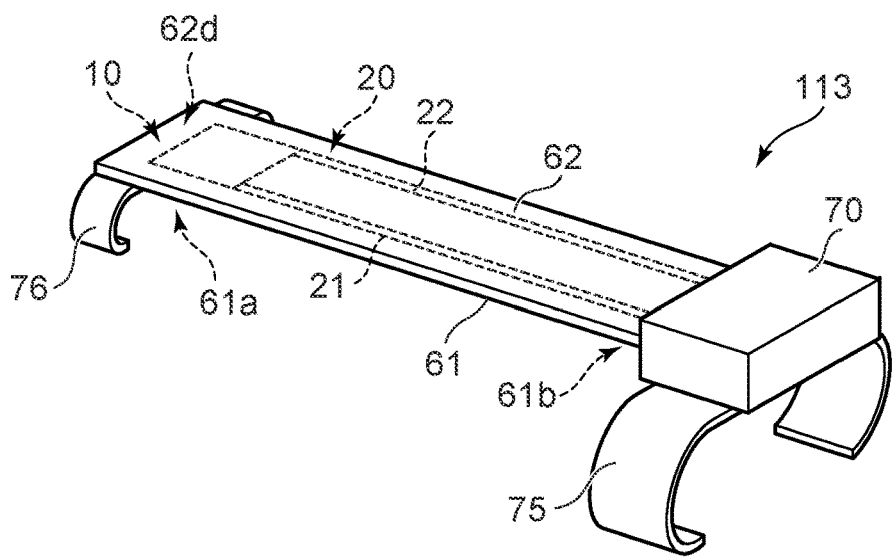
FIG. 6 is a schematic perspective view illustrating a radiation detector according to the second embodiment.

FIG. 6 is a schematic perspective view illustrating a radiation detector according to the second embodiment.

Figure 7:
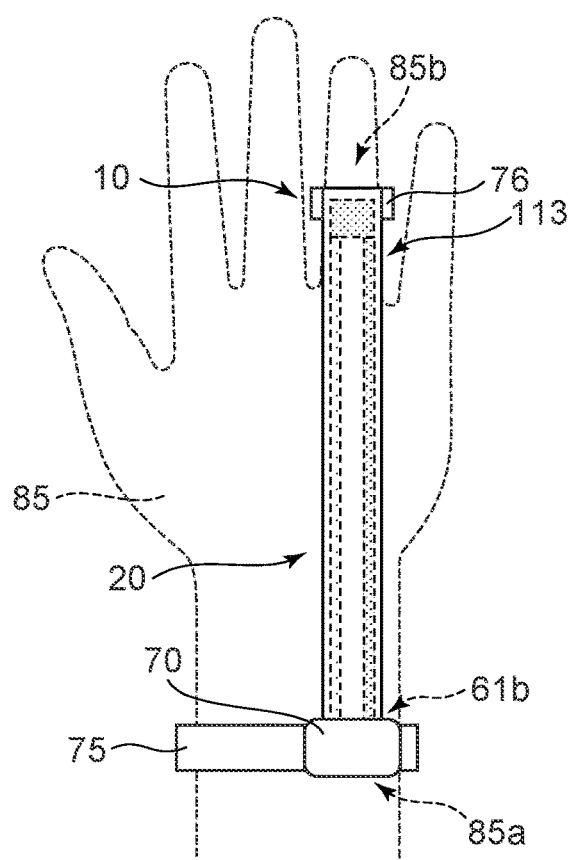
FIG. 7 is a schematic diagram illustrating a usage state of the radiation detector according to the second embodiment.

FIG. 7 is a schematic diagram illustrating a usage state of the radiation detector according to the second embodiment.

As shown in FIG. 6, a radiation detector 113 according to the embodiment includes the second holding part 76. Other configurations of the radiation detector 113 may be the same as those of the radiation detectors 110 to 112.

The second holding part 76 is fixed to at least one of the first partial region 61a or the fourth partial region 62d. In this example, the second holding part 76 includes two curved portions.

As shown in FIG. 7, the second holding part 76 is configured to determine a positional relationship between a second portion 85b of the body of the human subject 85 and the at least one of the first partial region 61a and the fourth partial region 62d. In this example, the second portion 85b is sandwiched between the two curved portions of the second holding part 76. The at least one of the first partial region 61a and the fourth partial region 62d is fixed to the second portion 85b. By providing the second holding portion 76, an easy-to-use radiation detector can be provided. The radiation detector is more versatile.

In the embodiment, the organic semiconductor layer 31 includes, for example, a p-type region and an n-type region. The p-type region includes, for example, at least one selected from the group consisting of polythiophene, polythiophene derivatives, phthalocyanine derivatives, and subphthalocyanine derivatives. The n-type region includes, for example, a fullerene derivative. In one example, the first organic semiconductor layer 31 includes, for example, Poly (3-hexylthiophene) and [6,6]-phenyl C61 butyric acid methyl ester.

The scintillator layer 41 includes, for example, at least one selected from the group consisting of PVT (Polyvinyltoluene), PVK (Polyvinylcarbazole), and PMMA (Polymethyl methacrylate). The scintillator layer 41 may include, for example, at least one selected from the group consisting of GAGG (gadolinium aluminum gallium garnet) and CsI (cesium iodide).

At least one of the first resin member 61 or the second resin member 62 includes, for example, a resin. The resin includes, for example, at least one selected from the group consisting of PET (polyethylene terephthalate), PEN (polyethylene naphthalate), Polyimide, and PC (polycarbonate).

In the embodiment, the radiation 81 includes X-rays and the like.

Embodiments may include the following configurations (e.g., technological proposals).

Configuration 1

A radiation detector, comprising:
a first resin member including a first partial region, a second partial region, and a third partial region between the first partial region and the second partial region;
a second resin member including a fourth partial region and a fifth partial region;
a detection part provided between the first partial region and the fourth partial region in a first direction, the detection part including a first conductive layer, a second conductive layer provided between the first conductive layer and the fourth partial region, and an organic semiconductor layer provided between the first conductive layer and the second conductive layer, the first direction crossing a second direction from the second partial region to the first partial region;
a wiring part provided between the third partial region and the fifth partial region in the first direction, the wiring part including a first wiring layer electrically connected with the first conductive layer, and a second wiring layer electrically connected with the second conductive layer, a third direction from the first wiring layer to the second wiring layer crossing a plane including the first direction and the second direction; and
a controller fixed to the second partial region, the controller being electrically connected with the first wiring layer and the second wiring layer, the controller being configured to output a detection signal according to an intensity of radiation incident on the detection part.

Configuration 2

The detector according to Configuration 1, wherein at least one of a part of the first resin member and a part of the second resin member is located between the first wiring layer and the second wiring layer in the third direction.

Configuration 3

The detector according to Configurations 1 or 2, wherein
a first wiring layer length along the second direction of the first wiring layer is larger than a first wiring layer width along the third direction of the first wiring layer, and
a second wiring layer length along the second direction of the second wiring layer is larger than a second wiring layer width along the third direction of the second wiring layer.

Configuration 4

The detector according to Configuration 3, wherein
the first wiring layer width is larger than a first wiring layer thickness along the first direction of the first wiring layer, and
the second wiring layer width is larger than a second wiring layer thickness along the first direction of the second wiring layer.

Configuration 5

The detector according to Configuration 4, wherein
the first wiring layer thickness is not less than 50 nm and not more than 500 nm,
the second wiring layer thickness is not less than 50 and not more than 1000 nm.

Configuration 6

The detector according to one of Configurations 3-5, wherein
the first wiring layer length is not less than 5 cm and not more than 30 cm, and
the second wiring layer length is not less than 5 cm and not more than 30 cm.

Configuration 7

The detector according to one of Configurations 3-6, wherein
the first wiring layer width is not less than 0.5 mm and not more than 5 mm, and
the second wiring layer width is not less than 0.5 mm and not more than 5 mm.

Configuration 8

The detector according to one of Configurations 1-7, wherein a thickness of the third partial region along the first direction is not less than 10 μm and not more than 100 μm.

Configuration 9
The detector according to one of Configurations 1-8, wherein a thickness of the fifth partial region along the first direction is not less than 10 μm and not more than 100 μm.

Configuration 10
The detector according to one of Configurations 1-9, further comprising a scintillator layer,
the first partial region being between the scintillator layer and the detection part in the first direction.

Configuration 11
The detector according to Configuration 10, wherein a thickness of a stacked body including the third partial region, the wiring part, and the fifth partial region is thinner than a thickness of a stacked body including the scintillator layer, the first partial region, the detection part, and the fourth partial region in the first direction.

Configuration 12
The detector according to one of Configurations 1-11, wherein
the first conductive layer includes a compound including a first element and oxygen, the first element including at least one selected from the group consisting of In, Sn, Ti and Zn, and
the second conductive layer includes at least one selected from the group consisting of Al, Ag and Mg.

Configuration 13
The detector according to one of Configurations 1-12, wherein
the first wiring layer includes a first conductive region, and a second conductive region electrically connected with the first conductive region,
the first conductive region includes a compound including a first element and oxygen, the first element includes at least one selected from the group consisting of In, Sn, Ti and Zn, and
the second conductive region includes at least one selected from the group consisting of Al, Ag and Mg.

Configuration 14
The detector according to Configuration 13, wherein a distance between the controller and the second conductive region is shorter than a distance between the controller and the first conductive region.

Configuration 15
The detector according to one of Configurations 1-14, further comprising a first holding part,
the first holding part being fixed to at least one of the second partial region or the controller, and
the first holding part is configured to determine a positional relationship between a first portion of a body of a human subject and the at least one of the second partial region and the controller.

Configuration 16
The detector according to Configuration 15, wherein the first portion is at least one of an arm, a hand or a wrist of the body of the human subject.

Configuration 17
The detector according to one of Configurations 1-16, further comprising a second holding part,
the second holding part being fixed to at least one of the first partial region or the fourth partial region;
the second holding part is configured to determine a positional relationship between a second portion of a body of a human subject and the at least one of the first partial region or the fourth partial region.

Configuration 18
The detector according to Configuration 17, wherein the second portion is a finger of the body of the human subject.

Configuration 19
The detector according to one of Configurations 1-18, wherein the controller includes a transmission circuit configured to wirelessly transmit the detection signal.

Configuration 20
The detector according to one of Configurations 1-19, wherein the controller includes a power supply part configured to control a potential between the first wiring layer and the second wiring layer.

According to embodiments, a radiation detector that can be expanded in use is provided.

In the specification, "a state of electrically connected" includes a state in which multiple conductors physically contact and a current flows between the multiple conductors. "a state of electrically connected" includes a state in which another conductor is inserted between the multiple conductors and a current flows between the multiple conductors.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in radiation detectors such as resin members, conductive layers, wiring layers, organic semiconductor layers, scintillator layers and controllers, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all radiation detectors practicable by an appropriate design modification by one skilled in the art based on the radiation detectors described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:
1. A radiation detector, comprising:
a first resin member including a first partial region, a second partial region, and a third partial region between the first partial region and the second partial region;
a second resin member including a fourth partial region and a fifth partial region;
a detection part provided between the first partial region and the fourth partial region in a first direction, the detection part including a first conductive layer, a second conductive layer provided between the first conductive layer and the fourth partial region, and an organic semiconductor layer provided between the first conductive layer and the second conductive layer, the first direction crossing a second direction from the second partial region to the first partial region;

a wiring part provided between the third partial region and the fifth partial region in the first direction, the wiring part including a first wiring layer electrically connected with the first conductive layer, and a second wiring layer electrically connected with the second conductive layer, a third direction from the first wiring layer to the second wiring layer crossing a plane including the first direction and the second direction; and a controller fixed to the second partial region, the controller being electrically connected with the first wiring layer and the second wiring layer, the controller being configured to output a detection signal according to an intensity of radiation incident on the detection part.

2. The detector according to claim 1, wherein at least one of a part of the first resin member and a part of the second resin member is located between the first wiring layer and the second wiring layer in the third direction.

3. The detector according to claim 1, wherein
a first wiring layer length along the second direction of the first wiring layer is larger than a first wiring layer width along the third direction of the first wiring layer, and
a second wiring layer length along the second direction of the second wiring layer is larger than a second wiring layer width along the third direction of the second wiring layer.

4. The detector according to claim 3, wherein
the first wiring layer width is larger than a first wiring layer thickness along the first direction of the first wiring layer, and
the second wiring layer width is larger than a second wiring layer thickness along the first direction of the second wiring layer.

5. The detector according to claim 4, wherein
the first wiring layer thickness is not less than 50 nm and not more than 500 nm,
the second wiring layer thickness is not less than 50 and not more than 1000 nm.

6. The detector according to claim 3, wherein
the first wiring layer length is not less than 5 cm and not more than 30 cm, and
the second wiring layer length is not less than 5 cm and not more than 30 cm.

7. The detector according to claim 3, wherein
first wiring layer width is not less than 0.5 mm and not more than 5 mm, and
the second wiring layer width is not less than 0.5 mm and not more than 5 mm.

8. The detector according to claim 1, wherein a thickness of the third partial region along the first direction is not less than 10 μm and not more than 100 μm.

9. The detector according to claim 1, wherein a thickness of the fifth partial region along the first direction is not less than 10 μm and not more than 100 μm.

10. The detector according to claim 1, further comprising a scintillator layer,
the first partial region being between the scintillator layer and the detection part in the first direction.

11. The detector according to claim 10, wherein a thickness of a stacked body including the third partial region, the wiring part, and the fifth partial region is thinner than a thickness of a stacked body including the scintillator layer, the first partial region, the detection part, and the fourth partial region in the first direction.

12. The detector according to claim 1, wherein
the first conductive layer includes a compound including a first element and oxygen, the first element including at least one selected from the group consisting of In, Sn, Ti and Zn, and
the second conductive layer includes at least one selected from the group consisting of Al, Ag and Mg.

13. The detector according to claim 1, wherein
the first wiring layer includes a first conductive region, and a second conductive region electrically connected with the first conductive region,
the first conductive region includes a compound including a first element and oxygen, the first element includes at least one selected from the group consisting of In, Sn, Ti and Zn, and the second conductive region includes at least one selected from the group consisting of Al, Ag and Mg.

14. The detector according to claim 13, wherein a distance between the controller and the second conductive region is shorter than a distance between the controller and the first conductive region.

15. The detector according to claim 1, further comprising a first holding part,
the first holding part being fixed to at least one of the second partial region or the controller, and
the first holding part is configured to determine a positional relationship between a first portion of a body of a human subject and the at least one of the second partial region and the controller.

16. The detector according to claim 15, wherein the first portion is at least one of an arm, a hand or a wrist of the body of the human subject.

17. The detector according to claim 1, further comprising a second holding part,
the second holding part being fixed to at least one of the first partial region or the fourth partial region;
the second holding part is configured to determine a positional relationship between a second portion of a body of a human subject and the at least one of the first partial region or the fourth partial region.

18. The detector according to claim 17, wherein the second portion is a finger of the body of the human subject.

19. The detector according to claim 1, wherein the controller includes a transmission circuit configured to wirelessly transmit the detection signal.

20. The detector according to claim 1, wherein the controller includes a power supply part configured to control a potential between the first wiring layer and the second wiring layer.

* * * * *